(12) United States Patent
Ly et al.

(10) Patent No.: US 12,104,280 B2
(45) Date of Patent: Oct. 1, 2024

(54) METHOD OF PROVIDING A WRINKLE PATTERN OR PRODUCING A SUBSTRATE HAVING A WRINKLE PATTERN OF A SINGLE LAYER

(71) Applicant: CITY UNIVERSITY OF HONG KONG, Kowloon (HK)

(72) Inventors: Thuc Hue Ly, Kowloon (HK); Lingli Huang, Kowloon (HK); Honglin Chen, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 169 days.

(21) Appl. No.: 17/849,579

(22) Filed: Jun. 24, 2022

(65) Prior Publication Data

US 2022/0411965 A1 Dec. 29, 2022

Related U.S. Application Data

(60) Provisional application No. 63/214,771, filed on Jun. 24, 2021.

(51) Int. Cl.
*C30B 25/10* (2006.01)
*C30B 25/18* (2006.01)
*C30B 29/46* (2006.01)
*B82Y 30/00* (2011.01)

(52) U.S. Cl.
CPC ............ *C30B 29/46* (2013.01); *C30B 25/105* (2013.01); *C30B 25/18* (2013.01); *B82Y 30/00* (2013.01)

(58) Field of Classification Search
CPC ...... C30B 23/00; C30B 23/002; C30B 23/005; C30B 23/02; C30B 23/025; C30B 23/06; C30B 23/063; C30B 25/00; C30B 25/02; C30B 25/10; C30B 25/105; C30B 25/16; C30B 25/18; C30B 25/186; C30B 29/00; C30B 29/10; C30B 29/46; C30B 30/00; B82Y 30/00
USPC ......... 117/88–89, 91, 93, 101–103, 105–106, 117/937, 956
See application file for complete search history.

(56) References Cited

PUBLICATIONS

Ly, et al. publication entitled "Observing grain boundaries in CVD-grown monolayer transition metal dichalcogenides," ACS Nano, vol. 8, No. 11, pp. 11401 408, (2014). (Year: 2014).*
Keyshar, et al. publication entitled "Chemical vapor deposition of monolayer rhenium disulfide (ReS2)," Advanced Materials, vol. 27, pp. 2640-2648 (2015). (Year: 2015).*

* cited by examiner

*Primary Examiner* — Kenneth A Bratland, Jr.
(74) *Attorney, Agent, or Firm* — CONLEY ROSE, P.C.; Michael W. Piper; Andrew M. Metrailer

(57) ABSTRACT

Disclosed herein is a method of producing a substrate having a wrinkle pattern of a single-layer rhenium disulfide ($ReS_2$) nanoflakes deposited thereon. The method is characterized by using ammonium rhenium and sulfur powders as the rhenium source and the sulfur source, respectively; and with the addition of molecular sieve to control the release of the rhenium source during the deposition of $ReS_2$, in which a single layer of $ReS_2$ is deposited on a substrate via chemical vapor deposition. The single-layer $ReS_2$ is then exposed to UV light to induce the formation of a wrinkle pattern.

10 Claims, 7 Drawing Sheets

METHOD OF PROVIDING A WRINKLE PATTERN OR PRODUCING A SUBSTRATE HAVING A WRINKLE PATTERN OF A SINGLE LAYER

CROSS-REFERENCE TO RELATED APPLICATIONS

This application claims priority and the benefit of U.S. Provisional Patent Application No. 63/214,771, filed Jun. 24, 2021, the entirety of which is incorporated herein by reference

BACKGROUND OF THE INVENTION

1. Field of the Invention

The present invention relates to methods of forming a single-layer of rhenium disulfide ($ReS_2$); and more particularly, to methods of forming a controlled wrinkle pattern of single-layer $ReS_2$ on a substrate.

2. DESCRIPTION OF RELATED ART

In recent years, two-dimensional transition metal dichalcogenide (TMDc), as an emerging two-dimensional material, has high carrier mobility, mechanical flexibility, chemical stability and photosensitivity, and is an ideal candidate material for future flexible electronic, optoelectronic and photovoltaic devices. Two-dimensional $ReS_2$ is preferred over other TMDc materials for its highly symmetrical structure. It has the characteristics of distorted 1T phase and in-plane anisotropy. Meanwhile, it keeps direct bandgap with increasing thickness due to interlayer decoupling property. These characteristics make it not only suitable for electronics and photovoltaics field like other two-dimensional materials, it also has great development potential in the fields of flexible devices, anisotropic photodetectors and integrated polarization controllers that are sensitive to polarized light.

At present, the single-layer $ReS_2$ is usually produced by mechanical exfoliation and chemical vapor deposition (CVD), however, the mechanical exfoliation can only produce a limited number of single-layer $ReS_2$ that is relatively small in size. For the preparation of large-scale single-layer $ReS_2$, the CVD method is favored over the mechanical exfoliation. Further, existing methods for modulating the structure of 2-D materials are usually complicated, and there are few reports on the structure modulated single-layer $ReS_2$.

The present disclosure aims to provide a modulated structure of single-layer $ReS_2$ by use of ultraviolet (UV) irradiation, such structure has a wide potential application in optics, electrics, mechanics, sensor etc.

SUMMARY

Embodiments of the present disclosure relate to methods of forming substrates independently having a wrinkle pattern of a single-layer rhenium disulfide ($ReS_2$) nanoflakes, and such substrates may serve as an optic, an electronic device, a mechanical sensor etc. The objective of the present disclosure therefore is to provide a method of producing a substrate having a wrinkle pattern of a single-layer rhenium disulfide ($ReS_2$) nanoflakes deposited thereon in a reaction chamber, in which the reaction chamber has a tubular body having first and second temperature zones, and first and second containers, and the method includes steps of:

(a) placing sulfur powders in the first container;
(b) placing ammonium perrhenate evenly in the second container;
(c) covering the evenly placed ammonium perrhenate of step (b) with a plurality of molecular sieves;
(d) mounting the substrate above the plurality of molecular sieves of step (c);
(e) placing the first container of step (a) and the second container of step (d) into the tube furnace, in which the first and second containers are respectively under the first and second temperature zones;
(f) purging the reaction chamber of the step (e) with an inert gas, in which the inert gas flows from the first temperature zone towards the second temperature zone;
(g) subjecting the reaction chamber in a heating program, in which the temperature in the first temperature zone is raised from room temperature to 200° C. in 30 minutes and kept for 10 minutes, while the temperature in the second temperature zone is raised from room temperature to 600-950° C. in 30 minutes and kept for 10 minutes;
(h) allowing the temperature of the second temperature zone to cool down to 600° C.;
(i) cooling the reaction chamber to room temperature thereby depositing the single-layer $ReS_2$ nanoflakes on the substrate; and
(j) irradiating the substrate of step (i) with ultraviolet (UV) light until the single-layer $ReS_2$ nanoflakes deposited thereon forms the wrinkle pattern.

According to embodiments of the present disclosure, the sulfur powders in the first container and the ammonium perrhenate in the second container are present in a ratio of 10:1 by weight. In one preferred embodiment, the sulfur powders, and the ammonium perrhenate are present in the ratio of 7:1 by weight.

Examples of the substrate suitable for use in the present method include, but are not limited to, a mica substrate, a sapphire substrate, and the like.

Examples of the inert gas suitable for use in the present method include, but are not limited to, nitrogen, argon, and the like. In certain embodiments, in the step (f), the reaction chamber is purged with argon at a flow rate of 50-100 $cm^3$/min, preferably, the reaction chamber is purged with argon at the flow rate of 80 $cm^3$/min.

According to embodiments of the present disclosure, in the step (j), the irradiation is performed in a humidity level of 30-80% in the presence of the inert gas for a period of 60-450 seconds. Preferably, the irradiation is performed in a humidity level of 60% in the presence of the nitrogen for 180 seconds.

According to further embodiments of the present disclosure, the irradiation is performed via use of with two UV lights respectively set at the wavelengths of 254 nm and 185 nm.

Other and further embodiments of the present disclosure are described in more detail below.
1. In a further aspect, embodiments of the disclosure includes a method of providing a wrinkle pattern onto rhenium disulfide ($ReS_2$) flakes comprising the steps of:
(a) providing $ReS_2$ flakes; and
(j) irradiating the $ReS_2$ flakes with ultraviolet (UV) light until the $ReS_2$ flakes forms a wrinkle pattern.

It is possible in some cases where the $ReS_2$ flakes are prepared in a separate process by a third party supplier, to be irradiated to produce the wrinkles.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Embodiments of the present disclosure include improved methods of producing a substrate having a wrinkle pattern of single-layer $ReS_2$ formed thereon, such a substrate may be used, for example, in the field of electronic devices, photovoltaic devices, optoelectronic devices etc. Methods in accordance with embodiments of the present disclosure are advantageously simple, easy-to-use, and pollution-free, thus are suitable for producing substrates having desired controlled wrinkle patterns of single-layer $ReS_2$ in large scale.

The present method is characterized in forming a wrinkle pattern of single-layer of $ReS_2$ on a substrate in a controlled manner, thereby producing substrates suitable for wide range applications in large scale. To this purpose, an atomic crystal layer of $ReS_2$ (i.e., single-layer of $ReS_2$) is first formed on a substrate via chemical vapor deposition (CVD) in a reaction chamber (e.g., a tube furnace), and then the substrate is exposed to ultraviolet light at conditions suitable for forming a controlled wrinkle pattern structure.

Figure 1A:
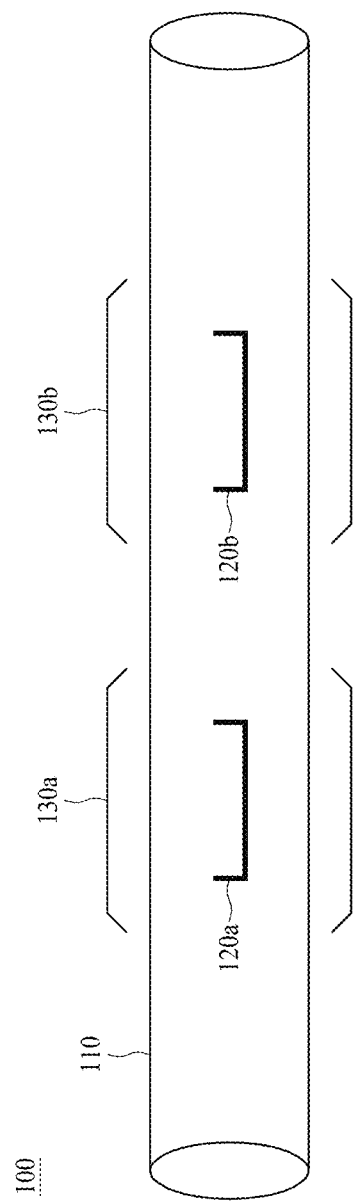
FIG. 1A is a schematic diagram of a tube furnace 100 in accordance with preferred embodiments of the present disclosure.

Reference is made to FIG. 1A, which is schematic diagram of a tube furnace 100 suitable for implementing the present method. The tube furnace 100 includes in its structure, at least, a tubular body 110; and first and second containers 120a, 120b independently for housing reactants necessary for the formation of single-layer of $ReS_2$, including but is not limited to, the rhenium source, and the sulfur source. Further, the first and second containers 120a, 120b are disposed within the tubular body 110, with the first container 120a being upstream to the second container 120b. The tubular body 110 has first and second temperature zones 130a, 130b, in which each temperature zone may be set at same or different temperatures. Note that in the present disclosure, each temperature zone refers to a certain section of the tubular body 110 coupled to at least, a heater and a temperature sensor (not visible from FIG. 1A), to bring the temperature of that certain section of the tubular body 110 to any pre-designated value during deposition of $ReS_2$.

Figure 1B:
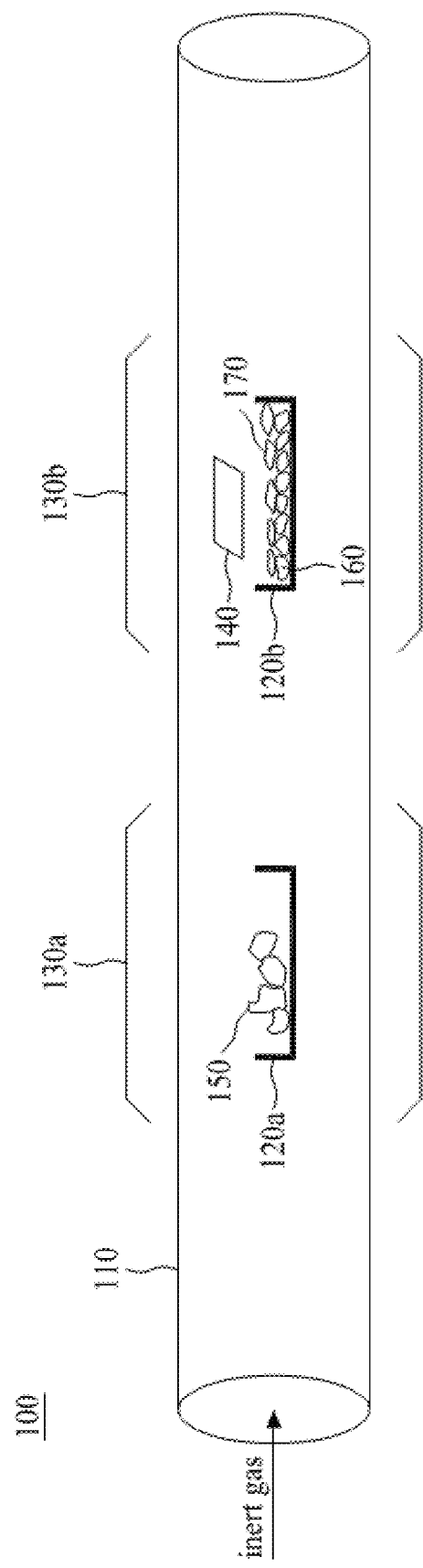
FIG. 1B is a schematic diagram depicting the tube furnace 100 of FIG. 1A in operation in accordance with preferred embodiments of the present disclosure.

Reference is now made to FIG. 1B, which depicts the tube furnace 100 of FIG. 1A in operation. The present method commences from placing a sufficient amount of sulfur powders 150 in the first container 120a, while at the same time, placing a sufficient amount of ammonium perrhenate 160 evenly at the bottom of the second container 120b, then covering the evenly placed ammonium perrhenate 160 with a plurality of molecular sieves 170, finally, mounting a substrate 140 above the molecular sieves 170 without direct contacting them. Preferably, the sulfur powders 150 in the first container 120a and the ammonium perrhenate 160 in the second container 120b are present in a ratio of 10:1 by weight, such as 10:1, 9:1, 8:1, 7:1, 6:1, 5:1, 4:1, 3:1, and 2:1; more preferably, the sulfur powders 150, and the ammonium perrhenate 160 are present in the ratio of 7:1 by weight. Further, the plurality of molecular sieves 170 (e.g., 4 Å spherical molecular sieves) are crushed into pieces via use of a mortar. Examples of the substrate suitable for use in the present method include, but are not limited to, a mica substrate, a sapphire substrate etc.

The first and second container 120a, 120b are then placed into the tubular body 110 of the tube furnace 100, in which the first and second containers 120a, 120b are respectively under the first and second temperature zones 130a, 130b, so that they may be subsequently subjected to heating programs for the deposition of $ReS_2$. Prior to commencing the heating programs, the tubular body 110 is purged with an inert gas to completely replace air therein with the inert gas. Examples of the inert gas suitable for use in the present method include, but are not limited to, helium, nitrogen, argon, etc. Preferably, the tubular body 110 is purged with argon, in which the argon flows from upstream to downstream of the tubular body 110, that is, from the first temperature zone 130a towards the second temperature zone 130b. According to embodiments of the present disclosure, the tubular body 110 is purged with argon at a flow rate of 50-100 cm³/min, such as 50, 60, 70, 80, 90 and 100 cm³/min, more preferably, the tube furnace 100 is purged with argon at the flow rate of 80 cm³/min.

The tube furnace 100, in which the first and second container 120a, 120b are respectively under the first and second temperature zones 130a, 130b, is then subjected to heating programs. Upon commencing the heating programs, the temperature in the first temperature zone 130a is raised from room temperature to about 200° C. in 30 minutes and kept at 200° C. for another 10 minutes; while the temperature in the second temperature zone 130b is raised from room temperature to 600-950° C. in 30 minutes and kept at 600-950° C. for another 10 minutes. The heating programs described herein will cause vaporization of the materials respectively housed in the first and second containers 120a, 120b (e.g., sulfur powders, and ammonium perrhenate), the vaporized materials are subsequently deposited on the surface of the substrate 140 mounted in the second container 120b when the tube furnace, particularly, the second temperature zone 130b, is cooled, thereby forming the desired single-layer $ReS_2$. According to preferred embodiments of the present disclosure, the temperature in the first temperature zone 130a is raised from room temperature to about 200° C. in 30 minutes and kept at 200° C. for another 10 minutes; while the temperature in the second temperature zone 130b is raised from room temperature to 850° C. in 30 minutes and kept at 850° C. for another 10 minutes. After the heating program, let the temperature in the second temperature zone 130b returns slowly and naturally to 600° C., while the temperature of the tube furnace 100 returns quickly (i.e., within about 5 minutes) to room temperature, thereby resulting the deposition of $ReS_2$ on the substrate 140. According to preferred embodiments of the present disclosure, the thus deposited $ReS_2$ is highly crystalline and has a thickness about 0.7 nm, which indicates that the $ReS_2$ deposited by the present method is in single-layer structure.

Then, the substrate 140 having a single-layer of $ReS_2$ deposited thereon is taken out of the tube furnace 110 and placed into a chamber equipped with ultraviolet (UV) lights. Preferably, the chamber is equipped with two UV lamps respectively set to emit UV lights at the wavelengths of 254 nm and 185 nm; more preferably, the UV light of 185 nm accounts only about 10% of the total UV light in the chamber. According to embodiments of the present disclosure, the substrate 140 is irradiated with ultraviolet (UV) light in the chamber described above in the condition where humidity is about 30-80% (e.g., 30%, 40%, 50%, 60%, 70% and 80% humidity), and in the presence of an inert gas (e.g., $N_2$, argon, etc) for a period of 60-450 seconds (e.g., 60, 70, 80, 90, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, or 450 seconds) to induce formation of the desired wrinkle patter on the single-layer of $ReS_2$. In one preferred embodiment, the irradiation is performed in the chamber described above at a humidity level of 60% in the presence of nitrogen for about 180 seconds to indued wrinkles on the single-layer of $ReS_2$. According to embodiments of the present disclosure, increasing exposure time to UV lights and/or humidity level will produce much denser wrinkle pattern structure and lower photoluminescence (PL) intensity. Such substrate, that is, the substrate having a wrinkle pattern of single-layer of $ReS_2$ thereon prepared in accordance with the method described above, may be used, for example, in the field of electronic devices, photovoltaic devices, optoelectronic devices etc.

EXAMPLES

Example 1: Preparation of a Mica Substrate Having a Wrinkle Pattern of Single-layer $ReS_2$ Deposited Thereon In this example, a mica substrate having a wrinkle pattern of a single-layer $ReS_2$ deposited thereon was prepared in a quartz tube furnace like the one depicted in FIG. 1, which comprised two heating areas respectively termed as temperature zones I and II.

1.1 Deposition of Single-layer $ReS_2$ on a Mica Substrate

To this purpose, in a quartz boat B, placed ammonium perrhenate powders (15 mg) evenly, and covered them with crushed pieces of 4 Å spherical molecular sieves, a mica substrate (about 1 cm² in size) was then mounted on the quartz boat B without contacting the molecular sieves. After that, the quartz boat B was put into the quartz tube furnace and was under the temperature zone II. At the same time, sulfur powders (100 mg) were placed inside a quartz boat A, which was then put into the quartz tube furnace and was under the temperature zone I. A flow of argon gas (300 cm³/min, 10 minutes) was injected into the quartz tube furnace to fully replace the air therein, then, the flow rate of argon was reduced to 80 cm³/min. Then, the quartz tube furnace was heated to raise the temperature in the temperature zone II from room temperature to 850° C. in 30 minutes and kept at it for 10 minutes; while the temperature in the temperature zone I was raised from room temperature to 200° C. in 30 minutes and kept at it for 10 minutes. After heating, let temperature zone II cooled down to 600° C., and quickly cooled down temperature I to room temperature to produce the monolayer $ReS_2$ nanoflakes. Results are provided in FIGS. 2 to 4.

Figure 2:
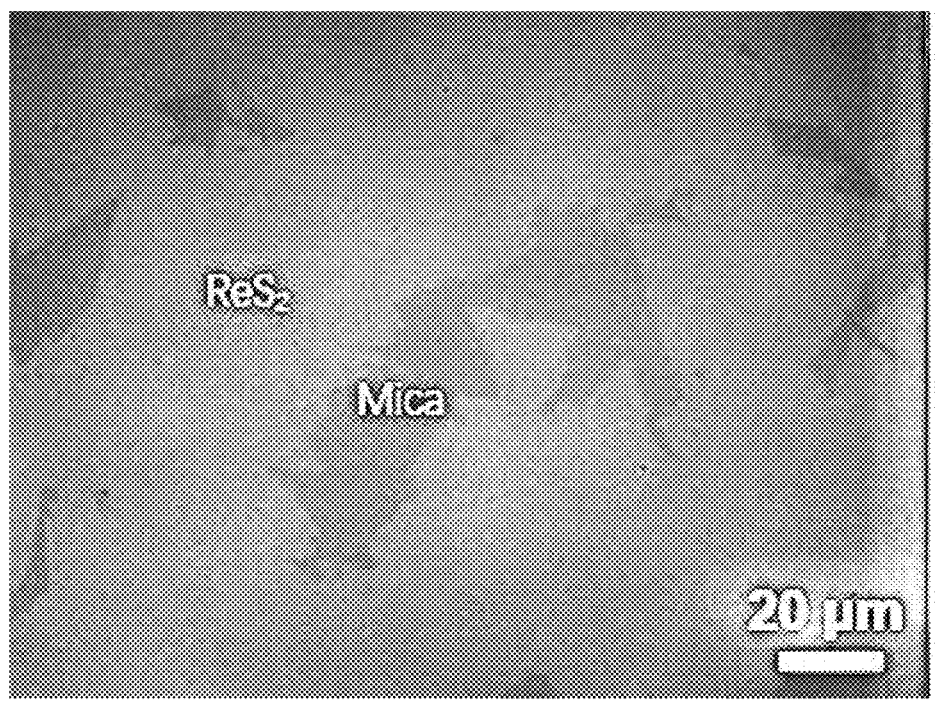
FIG. 2 is a photograph showing numerous $ReS_2$ nanoflakes deposited on a mica substrate in accordance with one embodiment of the present disclosure.
Figure 3:
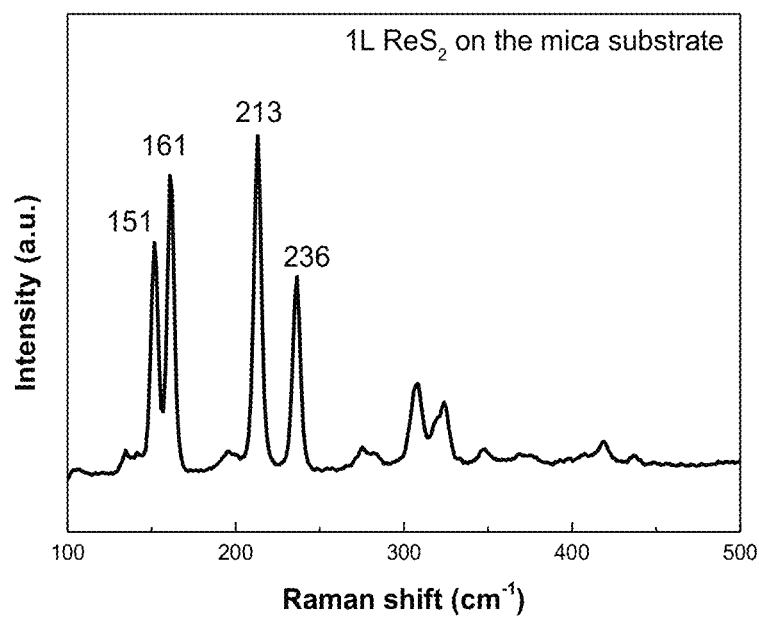
FIG. 3 is the Raman spectrum of the $ReS_2$ nanoflakes formed on the mica substrate in FIG. 2.
Figure 4:
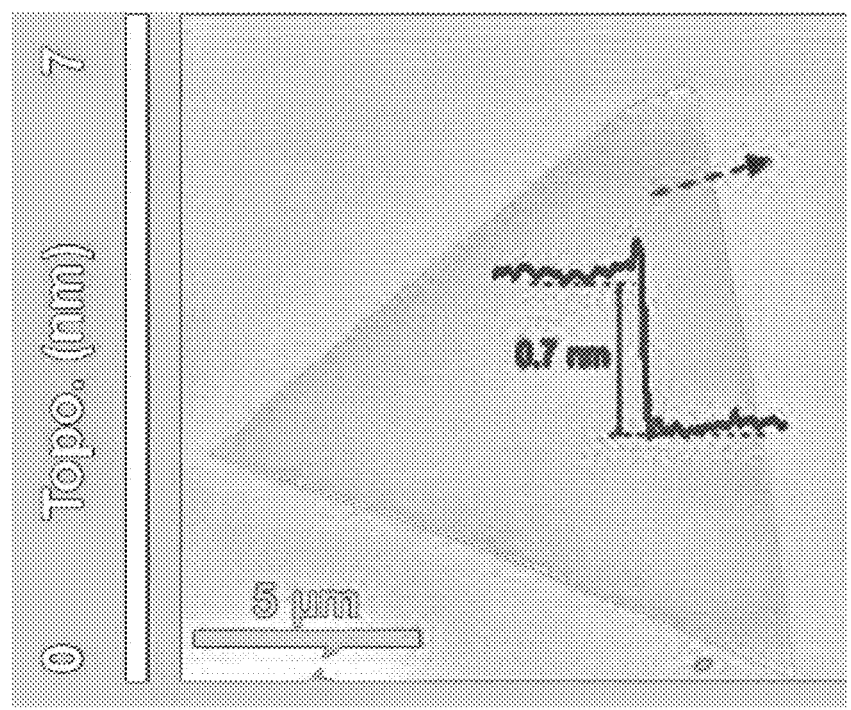
FIG. 4 is an atomic force microscope image of the $ReS_2$ nanoflakes formed on the mica substrate in FIG. 2.

FIG. 2 is the photograph showing numerous $ReS_2$ nanoflakes deposited on the mica substrate, while FIG. 3 is the Raman spectrum of the $ReS_2$ nanoflakes in FIG. 2, in which the characteristic peaks of $ReS_2$ could be easily identified therefrom, which was an indication of the formation of highly crystalline $ReS_2$. FIG. 4 is an atomic force microscope image of $ReS_2$ nanoflakes on the mica substrate, in which the $ReS_2$ nanoflakes thus formed was about 0.7 nm in thickness, indicating that the $ReS_2$ nanoflakes were indeed in a single-layer structure.

1.2 Forming a Wrinkle Pattern on the Single-layer $ReS_2$ of Example 1.1

Figure 5:
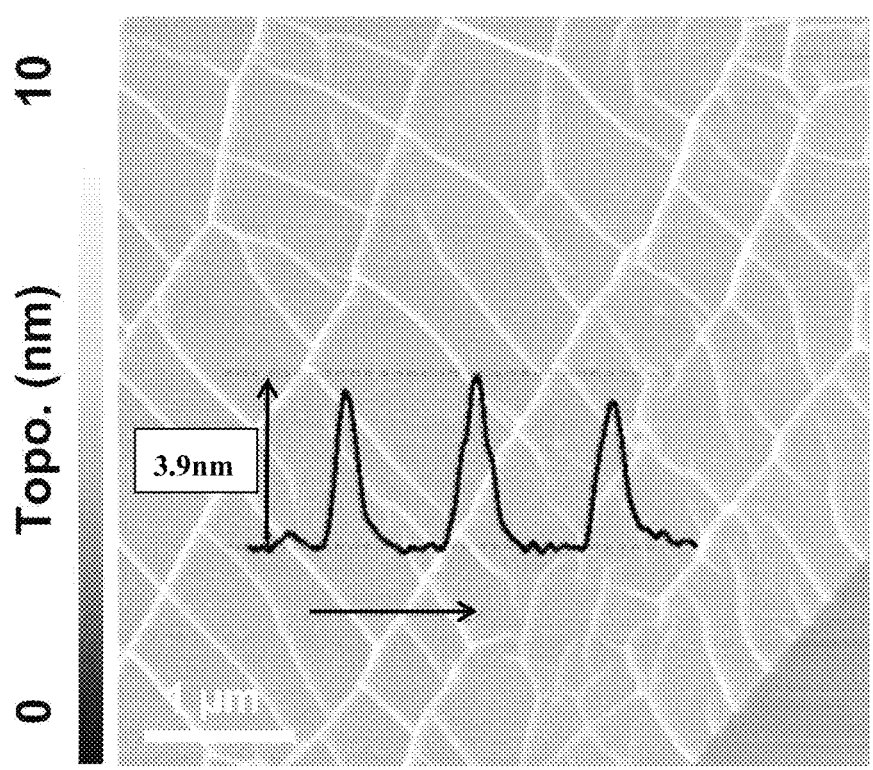
FIG. 5 is an atomic force microscope image of single-layer $ReS_2$ nanoflakes formed on the mica substrate in FIG. 2 after being exposed to UV light in accordance with one embodiment of the present disclosure.

The mica substrate of Example 1.1 was placed in a chamber equipped with two UV light sources. Then, the humidity in the reaction chamber was adjusted to be around 60% via use of a humidifier and inert gas (e.g., $N_2$). Then, the mica substrate was irradiated with the two UV lights respectively set to emit UV lights of 254 nm and 185 nm, in which the energy ratio of the UV light emitting 185 nm was about 10%. The wrinkle pattern structure started to appear after irradiating for about 180 seconds (FIG. 5).

Example 2: Preparation of a Sapphire Substrate Having a Wrinkle Pattern of Single-layer $ReS_2$ Deposited Thereon In this example, a substrate having a wrinkle pattern of a single-layer $ReS_2$ deposited thereon was prepared in accordance with the procedures described in Example 1, except a sapphire substrate (about 1 cm² in size) was used to replace the mica substrate. Results are provided in FIGS. 6 to 8.

Figure 6:
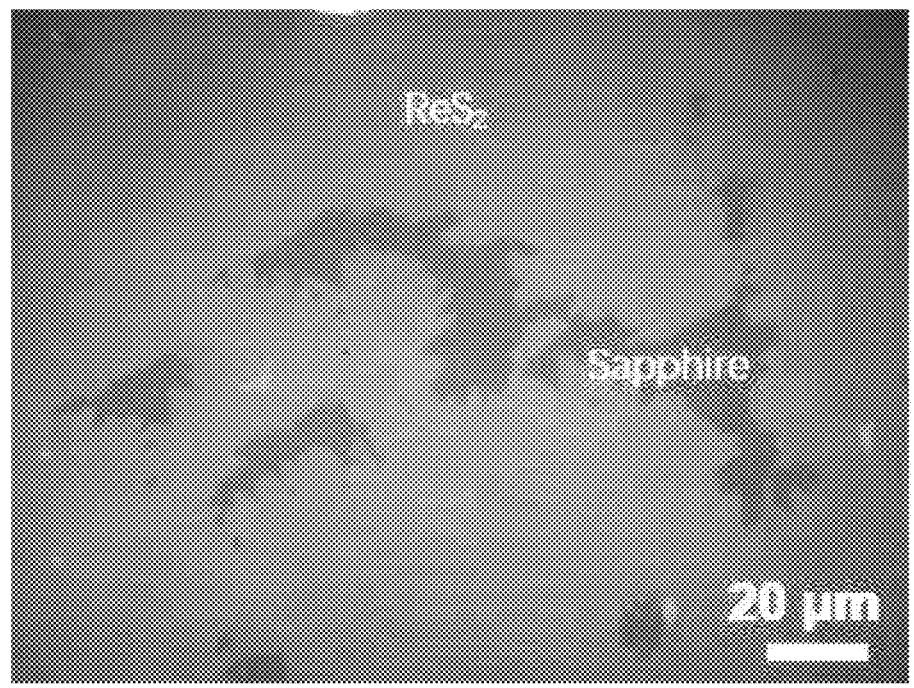
FIG. 6 is a photograph showing numerous $ReS_2$ nanoflakes deposited on a sapphire substrate in accordance with one embodiment of the present disclosure.
Figure 7:
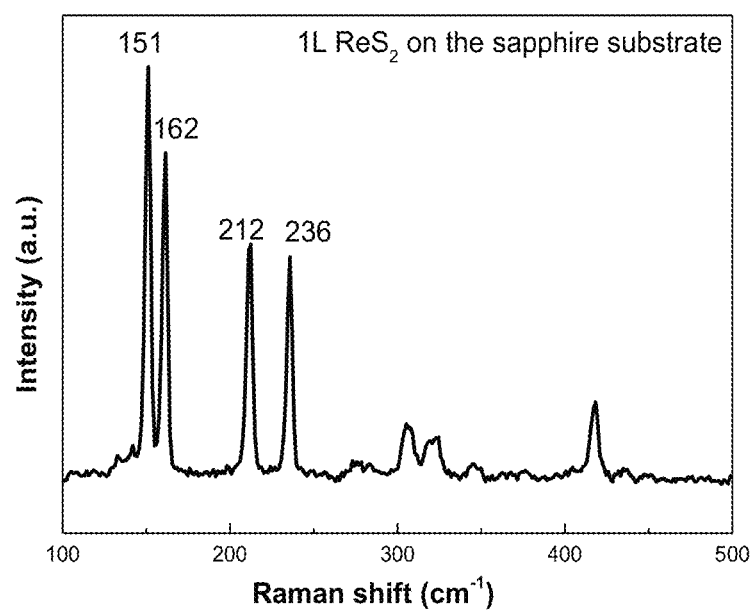
FIG. 7 is the Raman spectrum of the $ReS_2$ nanoflakes deposited on a sapphire substrate in FIG. 6.
Figure 8:
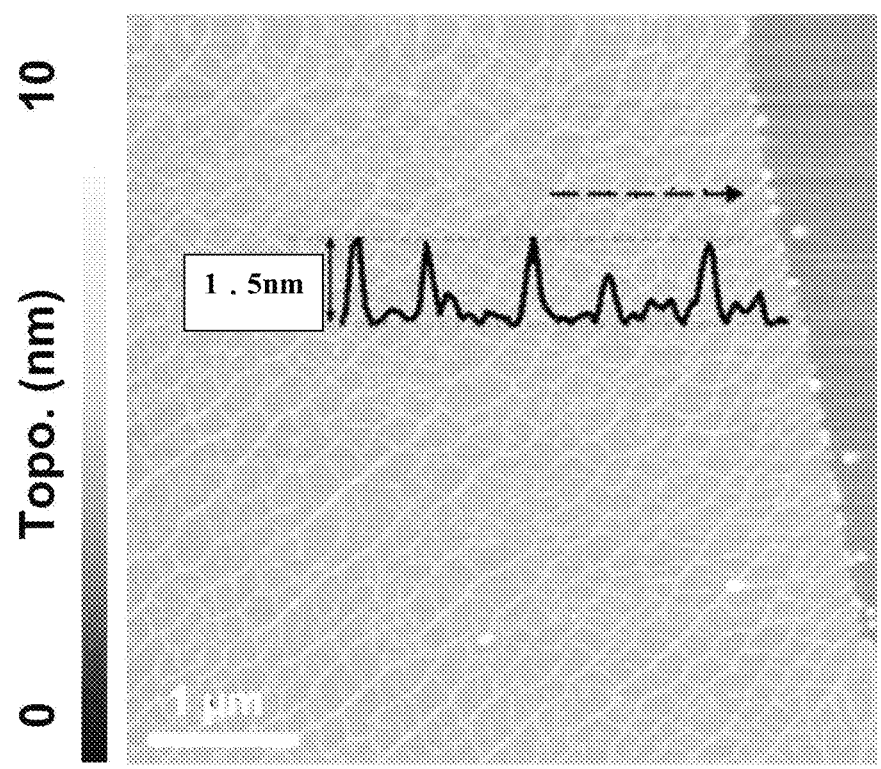
FIG. 8 is an atomic force microscope image of single-layer $ReS_2$ nanoflakes deposited on a sapphire substrate in FIG. 2 after being exposed to UV light in accordance with one embodiment of the present disclosure.

FIG. 6 is the photograph showing numerous $ReS_2$ nanoflakes deposited on the sapphire substrate, while FIG. 7 is the Raman spectrum of the $ReS_2$ nanoflakes in FIG. 6, in which the characteristic peaks of $ReS_2$ could be easily identified therefrom, which was an indication of the formation of highly crystalline ReS$_2$. Atomic force microscope image of ReS$_2$ nanoflakes on the sapphire substrate indicated that the ReS$_2$ nanoflakes thus formed was indeed in a single-layer structure (data not shown). The wrinkle pattern structure started to appear after the sapphire substrate had been irradiated with UV lights for about 180 seconds (FIG. 8).

Example 3: Effects of UV Exposure Time or Humidity Level on the Wrinkle pattern of the substrates of Examples 1 or 2

3.1 UV Exposure Time

Figure 9:
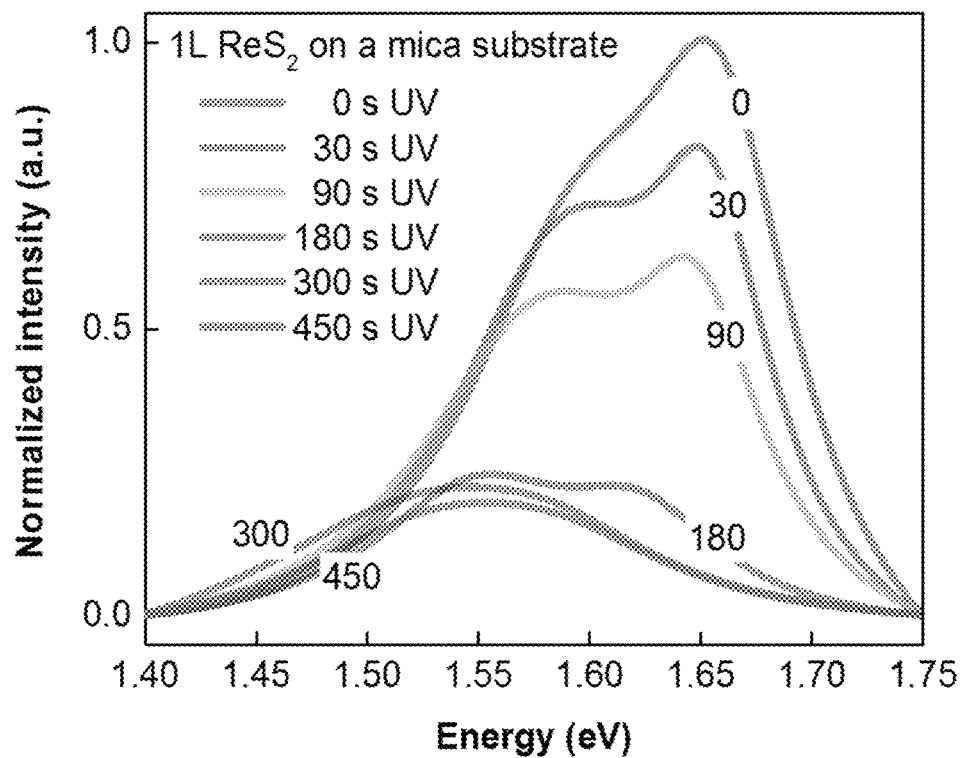
FIG. 9 depicts the effects of UV exposure time on the PL properties of $ReS_2$ nanoflakes formed on the mica substrate of Example 1 of the present disclosure.

The monolayer ReS$_2$ flakes grown on mica substrate by CVD method as mentioned in Example 1.1 was transferred to SiO$_2$/Si substrate and then was irradiated with ultraviolet lights emitted from two light sources of 254 nm and 185 nm, in which the energy of 185 nm ultraviolet light accounted for 10%, and the ReS$_2$ flake was irradiated for 30 s, 90 s, 180 s, 300 s, or 450 s, and the photoluminescence (PL) spectrum was recorded. Results are provided in FIG. 9. According to the data depicted in FIG. 9, the PL intensity of ReS$_2$ substrate significantly decreased with an increase in the UV exposure time, which indicated changes in the optical property of the monolayer ReS$_2$ formed on the mica substrate of Example 1.1.

Figure 10:
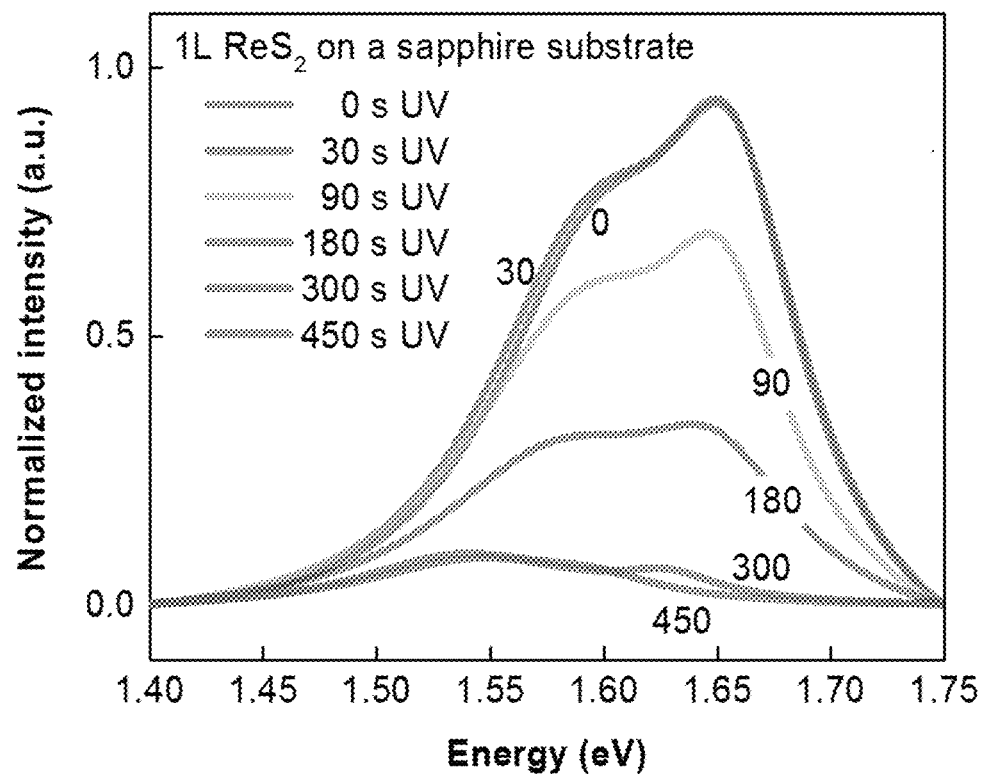
FIG. 10 depicts the effects of UV exposure time on the PL properties of $ReS_2$ nanoflakes deposited on the sapphire substrate of Example 2 of the present disclosure.

Similarly, the PL intensity of ReS$_2$ formed on sapphire substrate of Example 2.1 also decreased significantly with an increase in the UV exposure time, which indicated changes in the optical property of the monolayer ReS$_2$ (FIG. 10)

3.2 Humidity Level

In this example, effect of the humidity level during UV irradiation on the wrinkle pattern of single-layer ReS$_2$ formed on the mica substrate of Example 1.1 was investigated. To this purpose, the mica substrate of Example 1.1 was irradiated with ultraviolet lights emitted from two light sources of 254 nm and 185 nm, in which the energy of 185 nm ultraviolet light accounted for 10%, and the ReS$_2$ flake was irradiated for 180 seconds at the humidity level of 30% or 80%, and the atomic force microscopy images were respectively taken. Results are provided in FIG. 11.

Figure 11:
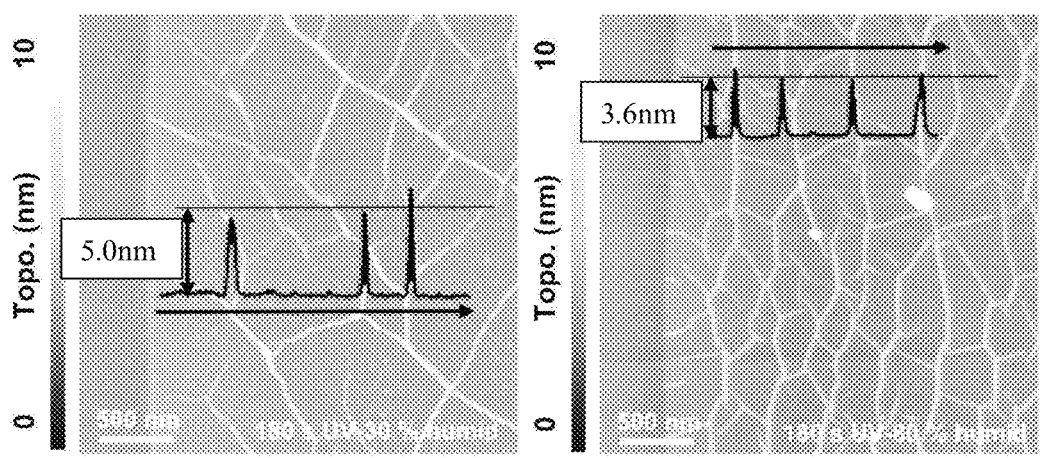
FIG. 11 are atomic force microscope images of a single-layer $ReS_2$ nanoflakes grown on a mica substrate in Example 1 of the present disclosure, in which the UV irradiation was performed at the humidity level of 30% (left panel) or 80% (right panel) in accordance with one preferred embodiment of the present disclosure.

According to the photos provided in FIG. 11, when irradiation was performed at higher humidity level (i.e., 80%), it gave a much wrinkle pattern structure as compared to that at lower humidity level (i.e., 30%).

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of the present disclosure.

For example, in a variation of the embodiments, ReS$_2$ flakes may be supplied by a preceding process, and irradiated in UV to produce the wrinkles in a current process.

What is claimed is:

1. A method of producing a substrate having a wrinkle pattern of a single-layer rhenium disulfide (ReS$_2$) nanoflakes deposited thereon in a reaction chamber, in which the reaction chamber has a tubular body having first and second temperature zones, and first and second containers, the method comprises,
   (a) placing sulfur powders in the first container;
   (b) placing ammonium perrhenate evenly in the second container;
   (c) covering the evenly placed ammonium perrhenate of step (b) with a plurality of molecular sieves;
   (d) mounting the substrate above the plurality of molecular sieves of step (c);
   (e) placing the first container of step (a) and the second container of step (d) into the tube furnace, in which the first and second containers are respectively under the first and second temperature zones;
   (f) purging the reaction chamber of the step (e) with an inert gas, in which the inert gas flows from the first temperature zone towards the second temperature zone;
   (g) subjecting the reaction chamber in a heating program, in which the temperature in the first temperature zone is raised from room temperature to 200° C. in 30 minutes and kept for 10 minutes, while the temperature in the second temperature zone is raised from room temperature to 600-950° C. in 30 minutes and kept for 10 minutes;
   (h) allowing the temperature of the second temperature zone to cool down to 600° C.;
   (i) cooling the reaction chamber to room temperature thereby depositing the single-layer ReS$_2$ nanoflakes on the substrate; and
   (j) irradiating the substrate of step (i) with ultraviolet (UV) light until the single-layer ReS$_2$ nanoflakes deposited thereon forms the wrinkle pattern.

2. The method of claim 1, wherein the sulfur powders and the ammonium perrhenate are present in a ratio of 10:1 by weight.

3. The method of claim 2, wherein the sulfur powders and the ammonium perrhenate are present in the ratio of 7:1 by weight.

4. The method of claim 1, wherein the substrate is a mica substrate or a sapphire substrate.

5. The method of claim 1, wherein the inert gas is nitrogen or argon.

6. The method of claim 5, wherein in the step (f), the reaction chamber is purged with argon at a flow rate of 50-100 cm$^3$/min.

7. The method of claim 6, wherein the reaction chamber is purged with argon at the flow rate of 80 cm$^3$/min.

8. The method of claim 1, wherein in the step (j), the irradiation is performed in a humidity level of 30-80% in the presence of the inert gas for a period of 60-450 seconds.

9. The method of claim 8, wherein the irradiation is performed with two UV lights respectively set at the wavelengths of 254 nm and 185 nm.

10. The method of claim 9, wherein the inert gas is nitrogen.

* * * * *